United States Patent
Nomoto et al.

(10) Patent No.: US 9,208,831 B2
(45) Date of Patent: *Dec. 8, 2015

(54) SEMICONDUCTOR MEMORY DEVICE

(71) Applicant: PS4 Luxco S.a.r.l., Luxembourg (LU)

(72) Inventors: Keisuke Nomoto, Tokyo (JP); Yuji Nakaoka, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/487,379

(22) Filed: Sep. 16, 2014

(65) Prior Publication Data

US 2015/0003178 A1    Jan. 1, 2015

Related U.S. Application Data

(63) Continuation of application No. 13/712,434, filed on Dec. 12, 2012, now Pat. No. 8,861,299.

(30) Foreign Application Priority Data

Dec. 22, 2011   (JP) ................................ 2011-281929

(51) Int. Cl.
| | |
|---|---|
| *G11C 5/14* | (2006.01) |
| *G11C 16/30* | (2006.01) |
| *G11C 7/10* | (2006.01) |
| *G11C 7/12* | (2006.01) |
| *G11C 11/4074* | (2006.01) |
| *G11C 11/4094* | (2006.01) |
| *G11C 11/4097* | (2006.01) |

(52) U.S. Cl.
CPC ........ *G11C 5/14* (2013.01); *G11C 5/147* (2013.01); *G11C 7/12* (2013.01); *G11C 11/4074* (2013.01); *G11C 11/4094* (2013.01); *G11C 11/4097* (2013.01); *G11C 16/30* (2013.01); *G11C 2207/005* (2013.01); *G11C 2207/2227* (2013.01)

(58) Field of Classification Search
CPC .......... G11C 5/147; G11C 16/30; G11C 5/14; G11C 2207/2227
USPC ................. 365/226, 227, 228, 229, 189.09
See application file for complete search history.

(56) References Cited

U.S. PATENT DOCUMENTS

| | | | |
|---|---|---|---|
| 5,940,785 A * | 8/1999 | Georgiou et al. | 702/132 |
| 8,861,299 B2 * | 10/2014 | Nomoto et al. | 365/229 |
| 2001/0028590 A1 * | 10/2001 | Ishikawa et al. | 365/226 |
| 2003/0067824 A1 * | 4/2003 | Janzen | 365/222 |
| 2011/0261639 A1 * | 10/2011 | Akiba et al. | 365/227 |
| 2012/0033506 A1 * | 2/2012 | Furutani et al. | 365/189.07 |

FOREIGN PATENT DOCUMENTS

| | | |
|---|---|---|
| JP | 2002-216478 A | 2/2002 |
| JP | 2011-034660 A | 2/2011 |

* cited by examiner

*Primary Examiner* — Ly D Pham

(57) ABSTRACT

A semiconductor device comprises a first pair of signal lines and a first control circuit. The first control circuit precharges each of the first pair of signal lines to a first voltage in response to a precharge signal, and changes the voltage level of each of the first pair of signal lines to a second voltage different from the first voltage when a deep power down signal is input.

16 Claims, 8 Drawing Sheets

SEMICONDUCTOR MEMORY DEVICE

This application is a continuation of U.S. patent application Ser. No. 13/712,434, filed Dec. 12, 2012, which is based upon and claims the benefit of priority from Japanese patent application No. 2011-281929, filed on Dec. 22, 2011, the disclosures of which are incorporated herein in their entireties by reference.

BACKGROUND OF THE INVENTION

1. Field of the Invention

This invention relates to a semiconductor memory device suitable for reduction of power consumption.

2. Description of Related Art

Reduction of power consumption has become a major problem also in the technical field of semiconductor memory devices and, in this technical field, reduction of power consumption during power down mode is particularly desired. In order to achieve this, when a semiconductor memory device is placed in power down mode, the power consumption is reduced by stopping power supply to the semiconductor memory device, or by stopping clocks. Deep power down (DPD) mode is one of such power down mode, in which power supply to a memory cell array in a semiconductor memory device is stopped while at the same time stopping clocks. During deep power down mode, all the input buffers except clock and clock enable buffers are stopped. When the semiconductor memory device is a DRAM (Dynamic Random Access Memory), refresh of memory cells in the memory cell array is also stopped during deep power down mode. Therefore, when the semiconductor memory device is a DRAM, data in the memory cells of the memory cell array is not held in the memory cells since accumulated electric charge is discharged. Thus, the deep power down mode is a mode which does not ensure retention of data in the memory cells.

Referring to FIG. 6, a related art of the invention will be described specifically. FIG. 6 is a block diagram showing an example of a semiconductor memory device, that is made by the applicant of this application for explaining the related art of the invention. FIG. 6A is a block diagram illustrating a relationship between main IO lines (input/output lines) (hereafter, referred to as the MIO lines) and local IO lines (hereafter, referred to as the LIO lines) in a DRAM cell array. FIG. 6B is a block diagram showing a relationship between a DRAM cell array 5 composed of a plurality of the memory cells (i.e. DRAM cells) 101 shown in FIG. 6A, a peripheral circuit and a power supply circuit. FIG. 6C is a circuit diagram showing a configuration example of the power supply control circuit A 801 shown in FIG. 6B.

As shown in FIG. 6A, a LOCAL-IO (T) 91 that is a data noninverting (T) local IO line and a LOCAL-IO (B) 92 that is a data inverting (B) local IO line connected to the memory cell 101 are connected to a MAIN-IO (T) 81 that is a data noninverting (T) main IO line and a MAIN-IO (B) 82 that is a data inverting (B) main IO line via transistors (n-channel MOS (metal-oxide semiconductor) transistors) T6 and T7, respectively. The transistors T6 and T7 are turned on or off by a control signal LMIOSW output by a row decoder (XDEC) not shown in the drawing.

As shown in FIG. 6B, power is supplied to an internal power supply circuit 601 and a power supply control circuit A 801 from an external power supply 501. The internal power supply circuit 601 supplied with power from the external power supply 501 outputs a supply voltage VARY and a precharging voltage hVcc to the memory cell array 5. This precharging voltage hVcc is of a magnitude corresponding to a half of a power supply voltage Vcc. The power supply control circuit A 801 converts the voltage output by the external power supply 501 to a supply voltage VPERI that is output to a peripheral circuit. When a deep power down signal is "H" level (i.e. during deep power down mode), the internal power supply circuit 601 reduces the voltage VARY and the voltage hVcc to the ground Vss level (or shuts down the output current), while the power supply control circuit A 801 reduces the voltage VPERI to the ground Vss level (or shuts down the output current).

The power supply voltage Vcc has substantially the same voltage value as that of the external power supply 501 (even though the voltage may drop due to a protection element or wiring inserted in the line), and is a voltage that is constantly supplied from the external power supply 501.

The memory cell array 5 is composed of a plurality of the memory cells 101 shown in FIG. 6A. The peripheral circuit 401 includes a column decoder (YDEC), a row decoder (XDEC), various buffer circuits, a command decoder, an address decoder, and the like. A MIO line pair 8 and the like are wired from the memory cell array 5 to the peripheral circuit 401. The MIO line pair 8 is composed of a MAIN-IO (T) 81 and a MAIN-IO (B) 82.

The power supply control circuit A 801 shown in FIG. 6B is composed of inverter s G21 and G22 and a p-channel MOS transistor T21 which are serially connected as shown in a simplified manner in FIG. 6C. A deep power down signal is input to an input of the inverter G21, and an output of the inverter G22 is connected to a gate of the transistor T21. A source of the transistor T21 is connected to the power supply Vcc, and the supply voltage VPERI is output from a drain of the transistor T21 to the peripheral circuit. When the deep power down signal becomes "L" level, the transistor T21 is turned on to output the voltage VPERI, whereas when the deep power down signal becomes "H level, the transistor T21 is turned off and the wiring of the power supply voltage Vcc becomes electrically disconnected from the wiring of the voltage VPERI. As a result, no current is supplied to the wiring of the voltage VPERI from the wiring of the power supply voltage Vcc.

In the semiconductor memory device shown in FIG. 6B, the VARY (supply voltage to the memory cell array), the hVcc (precharging voltage), and the VPERI (supply voltage to the peripheral circuit) are not supplied from the internal power supply circuit 601 and power supply control circuit A 801 during deep power down mode, due to the same configuration for the voltage VPERI shown in FIG. 6C.

However, as shown in FIG. 6C in a simplified manner, the power supply control circuit A 801 requires a switching element consisting of a transistor (i.e. the transistor T21). This switching element is formed in a large size according to a magnitude of current supplied to the peripheral circuit as a whole. Therefore, there is also a demand for eliminating this switching element for the purpose of reducing the chip area.

SUMMARY

As described above, the related art has a problem that when the current supply from the external power supply 501 or internal power supply circuit 601 to the peripheral circuit 401 or DRAM cell array 5 is controlled, during deep power down mode, by using a transistor serving as a switch, the transistor must be relatively large in size, resulting in increased chip area.

The present invention seeks to solve one or more of the above problems, or to improve upon those problems at least in part.

In one embodiment, there is provided a semiconductor memory device having a memory cell array including a plurality of memory cells, a peripheral circuit connected to the memory cell array by a plurality of input/output lines, and a power supply circuit which supplies an operation voltage to the memory cell array and the peripheral circuit during normal operation mode, and stops the supply of the operation voltage to the memory cell array without stopping the supply of the operation voltage to the peripheral circuit during power down mode.

According to this invention, during the power down mode in which supply of power and clocks to the memory cell array is stopped by the control circuit, the supply of the operation voltage to the peripheral circuit is continued while stopping the supply of the operation voltage to the memory cell array. Therefore, a control circuit for on/off controlling the voltage supplied to the peripheral circuit can be omitted, which makes it possible to reduce the chip area.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

A first embodiment of the invention will be described with reference to FIGS. 3A to 3C.

The semiconductor device according to the first embodiment is characterized by having a DRAM cell array 5 including a plurality of memory cells, a peripheral circuit 401 connected to the DRAM cell array 5 by a plurality of MAI-IO (T/B) 8, and power supply circuits 501, 601 which supply operation voltages hVcc and VARAY to the DRAM cell array 5 and an operation voltage VPERI to the peripheral circuit 401 during normal operation mode, and, during deep power down mode, stop the supply of the operation voltages to the memory cell array without stopping the supply of power to the peripheral circuit in response to a deep power down signal instructing the deep power down mode.

This configuration makes it possible to eliminate a large-sized transistor for stopping supply of power to the peripheral circuit according to the power down mode signal, and hence to reduce the chip area.

Further, the inventor of this invention has examined the following. When the aforementioned configuration according to the first embodiment is employed, that is, when the voltage VPERI supplied to the peripheral circuit 401 is constantly supplied without being cut off, a difference in potential between the MIO lines 81 and 82 and the LIO lines 91 and 92 during deep power down mode causes a problem as follows. This problem will be described with reference to FIG. 2 which is a block diagram showing a basic configuration example of memory cell arrays and a peripheral circuit in the semiconductor memory device.

Figure 2:
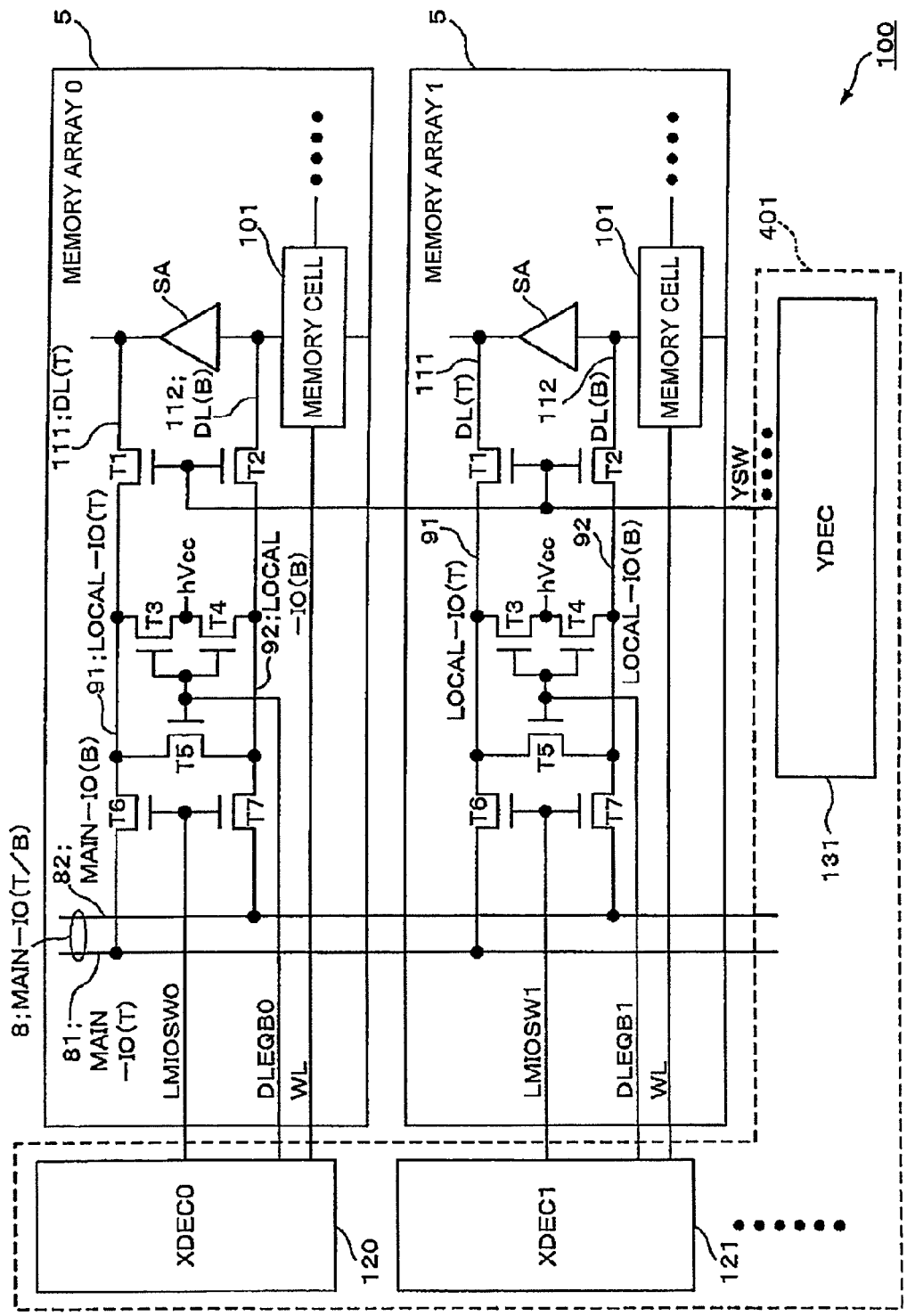
FIG. 2 is a block diagram showing a basic configuration example of a memory cell array including a LIO line precharge circuit and peripheral circuits in the semiconductor memory device 100 according to the embodiment of the invention.

The semiconductor memory device 100 shown in FIG. 2 includes a plurality of memory cell arrays 5 having the same configuration. These memory cell arrays 5 are connected to row decoders (XDEC) 120, 121, . . . and column decoders (YDEC) 131 in the peripheral circuit 401.

Each of the memory cell arrays 5 includes a plurality of memory cells 101, a plurality of sense amplifiers SA, and a plurality of sets of n-channel MOS transistors T1 to T7. The plurality of memory cells 101 are connected to the row decoders (XDEC) 120, 121, . . . via a word line WL. The memory cells 101 are connected to an inverting bit line DL (B) 112 while being connected a noninverting bit line DL (T) 111 via a sense amplifier SA. The noninverting bit line DL (T) 111 and inverting bit line DT (B) 112 are connected to a LOCAL-IO (T) 91 and a LOCAL-IO (B) 92 via switching transistors T1 and T2. The transistors T1 and T2 are on/off controlled by a column address selection line YSW driven by the column decoder (YDEC) 131. The LOCAL-IO (T) 91 and LOCAL-IO (B) 92 are connected to a noninverting MIO line 81 and inverting MIO line 82 via switching transistors T6 and T7. The transistors T6 and T7 are on/off controlled by control signals LMIOSW0, 1, . . . driven by the row decoders (XDEC) 120, 121, . . . . An equalizer circuit composed of transistors T3 to T5 is connected between the LOCAL-IO (T) 91 and the LOCAL-IO (B) 92. In this case, the drain or source of a transistor T5 is connected between the LOCAL-IO (T) 91 and the LOCAL-IO (B) 92, the source of the transistor T3 is connected to the LOCAL-IO (T) 91, and the source of the transistor T4 is connected to the LOCAL-IO (B) 92. The drains of the transistors T3 and T4 are connected to the precharging voltage hVcc. Control signals DLEQB0, DLWQBE1, . . . driven by the row decoders (XDEC) 120, 121, . . . are connected to the gates of the transistors T3 to T5.

In the configuration as shown in FIG. 2, the MIO lines 81 and 82 are normally precharged to "H" level (power supply voltage Vcc), while the LOCAL-IO (T) 91 and the LOCAL-IO (B) 92 are precharged to ½Vcc by the precharging voltage hVcc. However, during deep power down mode, the LIO lines 91 and 92 usually become the ground voltage Vss. Therefore, if the MAIN-IO (T) 81 and the MAIN-IO (B) 82 remain at Vcc, current (leak current flowing even when the transistors T6 and T7 are in the off state) will flow between the power supply Vcc and the ground Vss via the switching transistors T6 and T7 provided between the MAIN-IO (T) 81 and MAIN-IO (B) 82 and the LOCAL-IO (T) 91 and LOCAL-IO (B) 92. Therefore, during deep power down mode, this leak current may induce a problem that reduction of consumption current is restricted.

More specifically, in a memory cell array 0, as shown in FIG. 2, when the memory cell 101 is not accessed, the control signal LMIOSW0 is at "L" level, the YSW is also at "L" level, the DLEQB0 is at "H" level, the MIO lines 81 and 82 are at Vcc, and the LOCAL-IO (T) 91 and LOCAL-IO (B) 92 are at ½Vcc (hVcc). When the deep power down mode is established in this state, the hVcc becomes the ground Vss, but the control signals from the peripheral circuit 104 including the row decoder (XDEC0), the column decoder (YDEC) 131 and so on are maintained as they are. Therefore, both the LOCAL-IO (T) 91 and the LOCAL-IO (B) 92 are changed to the ground VSS level by the transistors T3 and T4 forming a LIO equalizer circuit provided between the LOCAL-IO (T) line 91 and the LOCAL-IO (B) line 92. This situation occurs between all the MIO lines 81 and 82 and the LIO lines 91 and 92 in the memory cell array 101, and the current value is increased significantly, leading to a problem that the power consumption is not reduced even though the power is cut down. This means that leak current may possibly flow between the MAIN-IO (T) 81 and MAIN-IO (B) 82 and the LOCAL-IO (T) 91 and LOCAL-IO (B) 92 if the power supply to the memory cell array 5 is turned off while the power supply to the peripheral circuit 401 is not turned off in a state in which the MAIN-IO (T) 81 and MAIN-IO (B) 82 have been precharged to "H" level.

A conventional technique to precharge the MIO lines to "H" level is disclosed, for example, in Japanese Laid-Open Patent Publication No. 2002-117673 (Patent Document 1).

Figure 7:
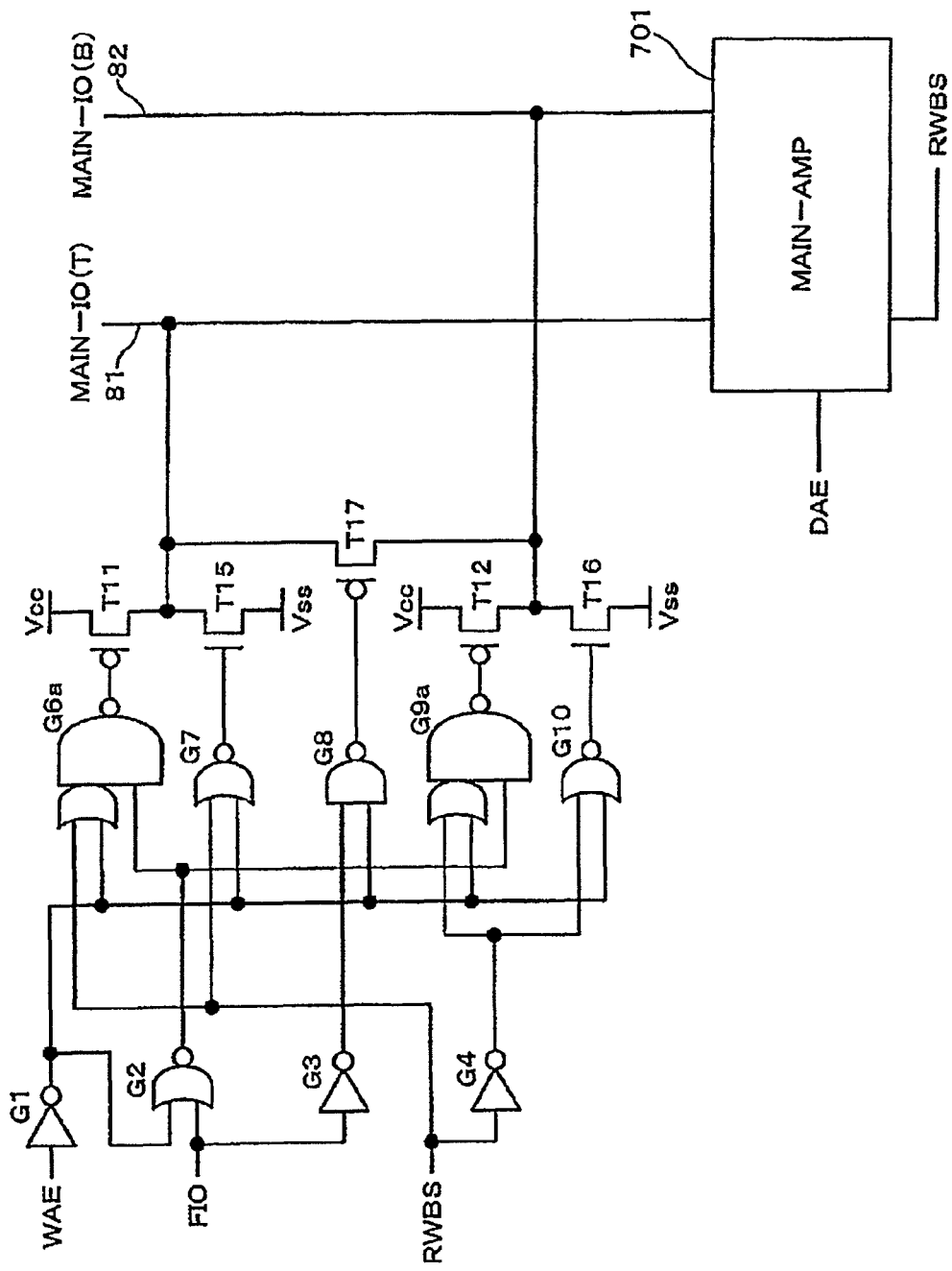
FIG. 7 is a block diagram showing a configuration example of a circuit for precharging the MIO line pair to "H" level.

With reference to FIG. 7, description will be made of a configuration example of a circuit which precharges the MIO lines to "H" level during normal operation mode, and precharges the MIO lines to "L" level during power down mode, as described above. The circuit shown in FIG. 7 includes a MAIN-IO (T) 81 and MAIN-IO (B) 82, gates G1 to G4, G6a, G7, G8, G9a and G10, a main amplifier circuit 701, and transistors T11, T12, and T15 to T17. In the example shown in FIG. 7, the MAIN-IO (T) 81 and the MAIN-IO (B) 82 are connected to the main amplifier circuit 701, while the transistors T11, T12, and T15 to T17 are also connected to the MAIN-IO (T) 81 and the MAIN-IO (B) 82. In this case, the MAIN-IO (T) 81 is connected to the drains of the p-channel MOS transistor T11 and the n-channel MOS transistor T15. The MAIN-IO (T) 82 is connected to the drains of the p-channel MOS transistor T12 and the n-channel MOS transistor T16. The sources of the p-channel MOS transistors T11 and T12 are connected to the power supply Vcc, and the sources of the n-channel MOS transistors T15 and T16 are connected to the ground Vss. The drain and source of the p-channel MOS transistor T17 are connected to the MAIN-IO (T) 81 or the MAIN-IO (B) 82.

The gate of the transistor T11 is connected to a negative logic output of an OR-NAND composite gate G6a. The gate of the transistor T15 is connected to a negative logic output of a NOR gate G7. The gate of the transistor T17 is connected to a negative logic output of a NAND gate G8. The gate of the transistor T12 is connected to a negative logic output of an OR-NAND composite gate G9a. The gate of the transistor T16 is connected to a negative logic output of a NOR gate G10.

A control signal WAE which becomes "H" level during WRITE mode is input to an inverter G1. An output of the inverter G1 is connected to one of the inputs of the NOR gate G2, one of the OR inputs of the composite gate G6a, one of the inputs of the NOR gate G7, one of the inputs of the NAND gate G8, one of the OR inputs of the composite gate G9a, and one of the inputs of the NOR gate G10.

A control signal FIO which becomes "H" level during precharge of the LOCAL-IO (T) 91 an LOCAL-IO (B) 92 is input to an inverter G3 and the other input of the NOR gate G2. An output of the inverter G3 is connected to the other input of the NAND gate G8. An output of the NOR gate G2 is connected to an AND input of the composite gate G6a and an AND input of the composite gate G9a.

Data which is input during WRITE mode, that is, data on a read/write bus RWBS is input to the other OR input of the composite gate G6a, the other input of the NOR gate G7, and an input of the inverter G4. An output of the inverter G4 is connected to the other OR input of the composite gate G9a and the other input of the NOR gate G10. When the data is written, complementary write data is generated on the MAIN-IO (T/B) based on this data on the read/write bus RWBS.

A control signal DAE for activating the main amplifier is input to the main amplifier circuit 701 when data is retrieved, and the data is output from the main amplifier to the read/write bus RWBS based on complementary data retrieved to the MAIN-IO (T) 81 and the MAIN-IO (B) 82. The MAIN-IO (T) 81 and the MAIN-IO (B) 82 are precharged to "H" level (power supply voltage Vcc) when the MAIN-IO precharge signal is at "L" level.

Accordingly, during deep power down mode, the state in which the transistors T11 and T12 are turned on and the MAIN-IO (T) 81 and the MAIN-IO (B) 82 are precharged to "H" level is maintained, while the LIO lines 91 and 92 are at the ground voltage Vss. As a result, leak current may possibly flow through the transistor T6 and T7 which are in the off state. Therefore, improvement is required to prevent this leak current from restricting reduction of consumption current.

Second Embodiment

Figure 1:
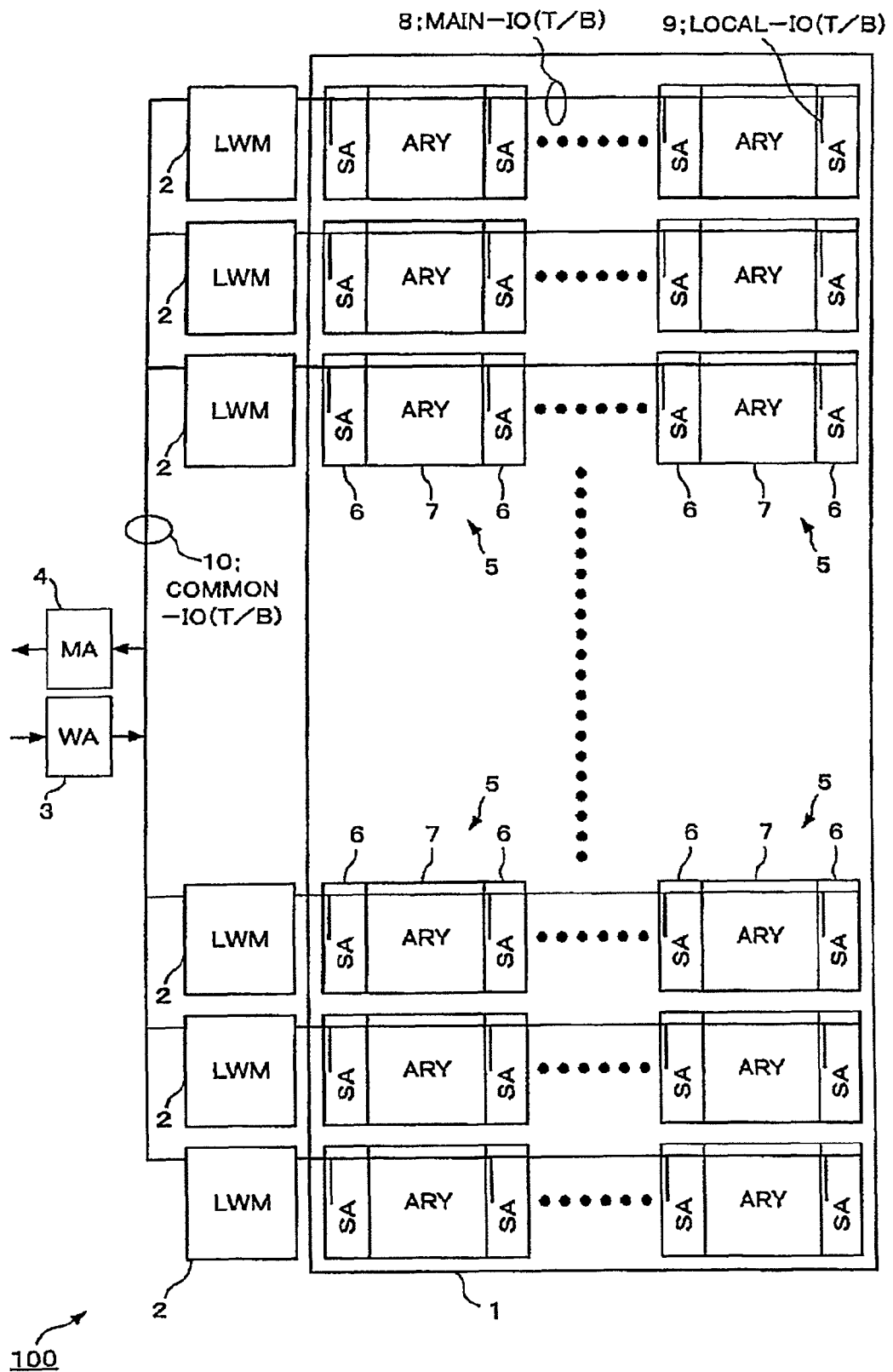
FIG. 1 is a block diagram showing a basic configuration example of a principal part of a semiconductor memory device 100 according to an embodiment of the invention.

A semiconductor memory device according to a second embodiment of the invention will be described with reference to the drawings. FIG. 1 is a block diagram showing a basic configuration example of a principal part of a semiconductor memory device 100 according to the second embodiment of the invention.

The semiconductor memory device 100 shown in FIG. 1 includes a memory mat 1, a plurality of local amplifiers 2, a write amplifier 3, and a main amplifier 4. The memory mat 1 is composed of a plurality of memory cell arrays 5. Each of the memory cell arrays 5 include a sense amplifier unit 6 having a plurality of sense amplifiers SA and a memory cell array unit 7 having a plurality of memory cells. Each of the memory cell arrays 5 has a MIO line pair 8 provided in common for the plurality of memory cell arrays 5, and a LIO line pair 9 connected and wired to the MIO line pair 8 in each of the memory cell arrays 5.

The plurality of local amplifiers 2 are provided between the MIO line pair 8 and a common IO line pair (CIO line pair) 10 to amplify signals which are input and output between the MIO line pair 8 and the common IO line pair 10. The write amplifier 3 amplifies a write signal input to the memory cell arrays 5. The main amplifier 4 amplifies a read signal output onto the common IO line pair 10.

A signal output from the memory cell array unit 7 is amplified by the sense amplifier unit 6, and transmitted to the MIO line pair 8 via the LIO line pair 9. The signal is then amplified by the corresponding local amplifier 2 and transmitted to the main amplifier 4 via the common IO line pair 10. The signal amplified by the main amplifier 4 is output to the outside. A write signal input from the outside is amplified by the write amplifier 3 and transmitted to the local amplifiers 2 via the common IO line pair 10. The signal is then transmitted to the memory cell array unit 7 via the MIO line pair 8 and the LIO line pair 9, and written in a predetermined memory cell designated by an input address.

The embodiment of the invention is not limited to the configuration shown in FIG. 1, but the configuration may be modified, for example, by omitting the plurality of local amplifiers 2 and integrating the MIO line pair 8 and the CIO line pair 10.

Next, referring to FIG. 2, a basic configuration example of the memory cell arrays each including a LIO line precharge circuit and the peripheral circuit 401 in the semiconductor memory device 100 according to the embodiment will be described. Since the configuration of FIG. 2 has been already described in the section of "background technology", description here will be made of a relationship between the components shown in FIG. 1 and components shown in FIG. 2. Corresponding components of FIG. 1 and FIG. 2 will be denoted by the same reference numerals.

FIG. 2 shows, in addition to the configuration shown in FIG. 1, a configuration of the peripheral circuit 401 which is composed of row decoders (XDEC) 120, 121, . . . respectively connected to a plurality of memory cell arrays 5, a column decoder (YDEC) 131 and the like. Each pair of LIO lines 91 and 92 in FIG. 2 corresponds to the LIO line pair 9 in FIG. 1. The local amplifiers 2, the write amplifier 3 and the main amplifier 4 in FIG. 1 are included in the peripheral circuit 401 in FIG. 2.

Figure 3A:
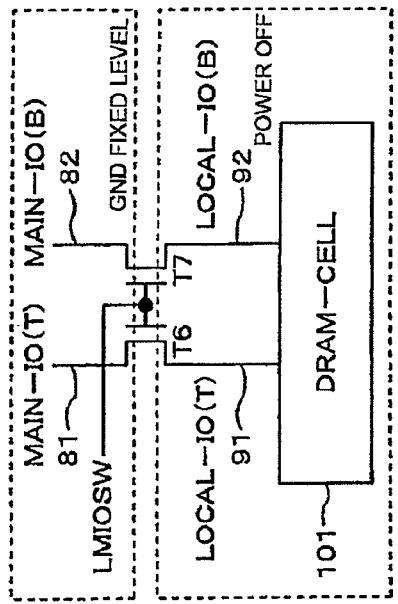
FIGS. 3A to 3C are block diagrams for explaining a configuration example of a circuit for controlling MIO lines 81 and 82 during deep power down mode in the semiconductor memory device 100 according to the embodiment.
Figure 3C:
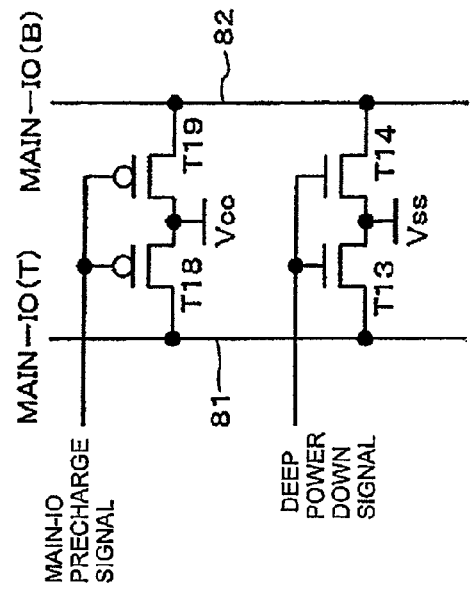
Figure 3B:
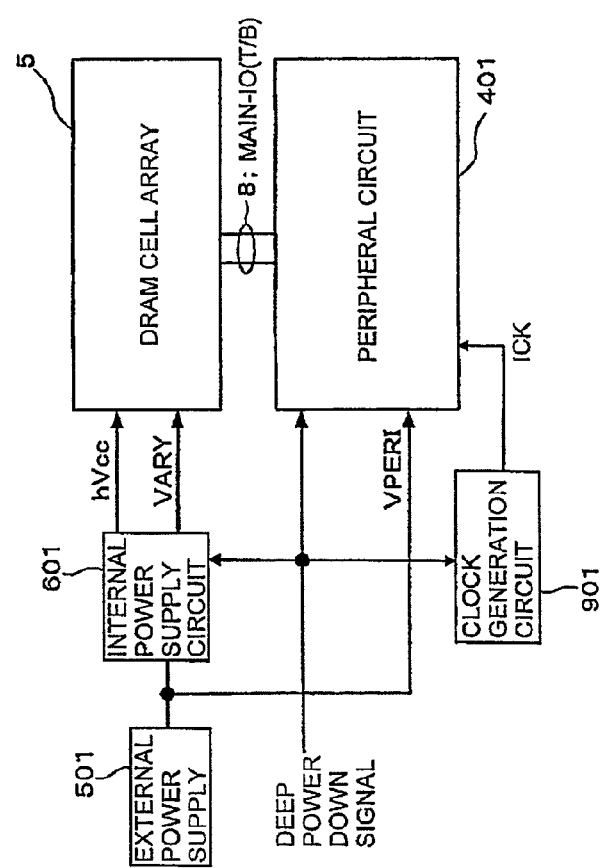
Figure 6A:
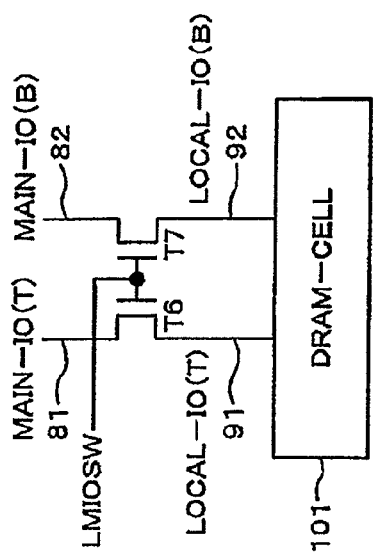
FIGS. 6A to 6C are block diagrams showing a semiconductor memory device including an internal power supply circuit and a power supply control circuit A controlled during deep power down mode.
Figure 6B:
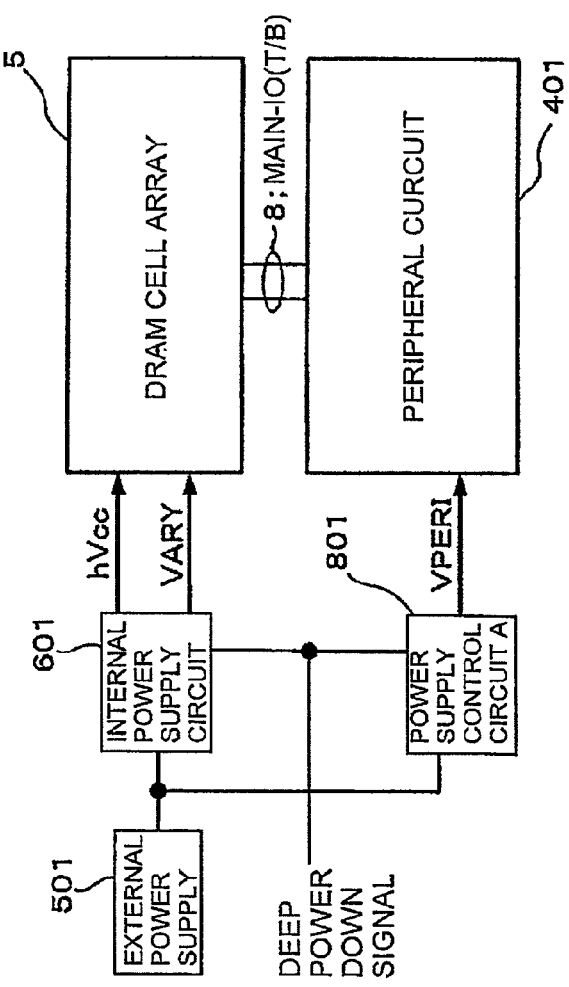
Figure 6C:
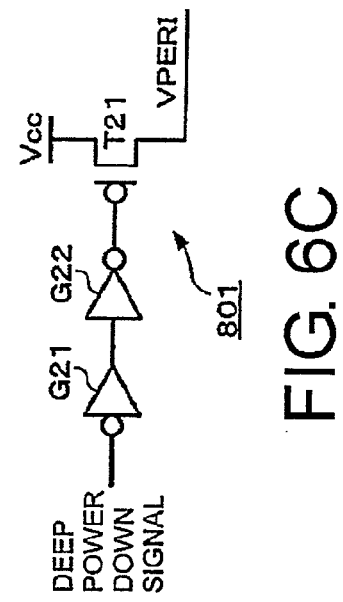

Referring to FIG. 3, description will be made of a configuration example of a circuit for controlling the MAIN-IO (T) 81 and MAIN-IO (B) 82 of the MIO line pair 8 during deep power down mode in the semiconductor memory device 100 according to this embodiment. In FIG. 3, like components to those shown in FIG. 6 are denoted by the same reference numerals. FIG. 3A is a block diagram showing a relationship between the MAIN-IO (T) 81 and MAIN-IO (B) 82 and the LOCAL-IO (T) 91 and LOCAL-IO (B) 92 in a memory cell array 5. FIG. 3B is a block diagram showing a relationship between the memory cell array 5 composed of a plurality of memory cells 101 shown in FIG. 3A and the peripheral circuit 401 and the internal power supply circuit 601. FIG. 3C is a circuit diagram showing a configuration example of a circuit for controlling the MAIN-IO (T) 81 and the MAIN-IO (B) 82 during deep power down mode, which characterizes this embodiment.

As shown in FIG. 3A, the noninverting and inverting LIO lines 91 and 92 connected to the memory cell 101 are connected to the MAIN-IO (T) 81 and MAIN-IO (B) 82 via the transistors T6 and T7. The transistors T6 and T7 are on/off controlled by control signals LMIOSW (i.e. LMIOSW0, LMIOSW1, . . . in FIG. 2) output by the row decoders 120, 121, . . . shown in FIG. 2.

As shown in FIG. 3B, power is supplied to the internal power supply circuit 601 from the external power supply 501. The internal power supply circuit 601, supplied with power from the output of the external power supply 501, outputs a supply voltage VARY and a precharging voltage hVcc to the memory cell array 5. This precharging voltage hVcc is a voltage with a magnitude corresponding to a half of the power supply voltage Vcc, for example. When the deep power down signal becomes "H" level, the internal power supply circuit 601 reduces the voltage VARY and the voltage hVcc to the ground Vss level (or shuts down the output current). In this embodiment, the power supply control circuit A 801 shown in FIG. 6 is omitted, and an output of the external power supply 501 is directly input to the peripheral circuit 401 as a voltage VPERI. A clock generation circuit 901 stops generation of an internal clock signal ICK during deep power down mode, that is, when the deep power down signal becomes "H" level.

In the second embodiment, as shown in FIG. 3B, the power supply control circuit A 801 is omitted. As shown in FIG. 3C, a pair of n-channel MOS transistors T13 and T14 is newly provided to change (and maintain) the MIO line pair 8 to (at) the ground Vss when the deep power down signal becomes "H" level. The transistor T13 is connected to the MAIN-IO (T) line 81 at its drain and to the ground Vss at its source, and a deep power down signal is input to its gate. The transistor T14 is connected to the MAIN-IO (B) line 82 at its drain and to the ground Vss at its source, and a deep power down signal is input to its gate. These transistors T13 and T14 may be provided in the peripheral circuit 401, for example.

The MIO line pair 8 is connected to a pair of p-channel MOS transistors T18 and T19 which connect the MIO line pair 8 to the power supply Vcc when the MIO line pair 8 is precharged. The transistor T18 connected to the MAIN-IO (T) line 81 at its drain and to the power supply Vcc at its source, and receives at its gate a control signal (MAIN-IO precharge signal) which becomes "L" level when the MIO lines are precharged. The transistor T19 is connected to the MAIN-IO (B) line 82 at its drain and to the power supply Vcc at its source, and receives at its gate a control signal which becomes "L" level when the MIO lines are precharged. These transistors T18 and T19 are controlled to be off during deep power down mode so that the power supply Vcc is not supplied to the MIO line pair 9.

In the semiconductor memory device 100 shown in FIG. 3B, during deep power down mode, the VARY (supply voltage to the memory cell array) and the hVcc (precharging voltage) from the internal power supply circuit 601 are cut off and the Vss is supplied. In addition, during deep power down mode, the LIO line pair 9 is controlled to the ground Vss level.

Figure 4:
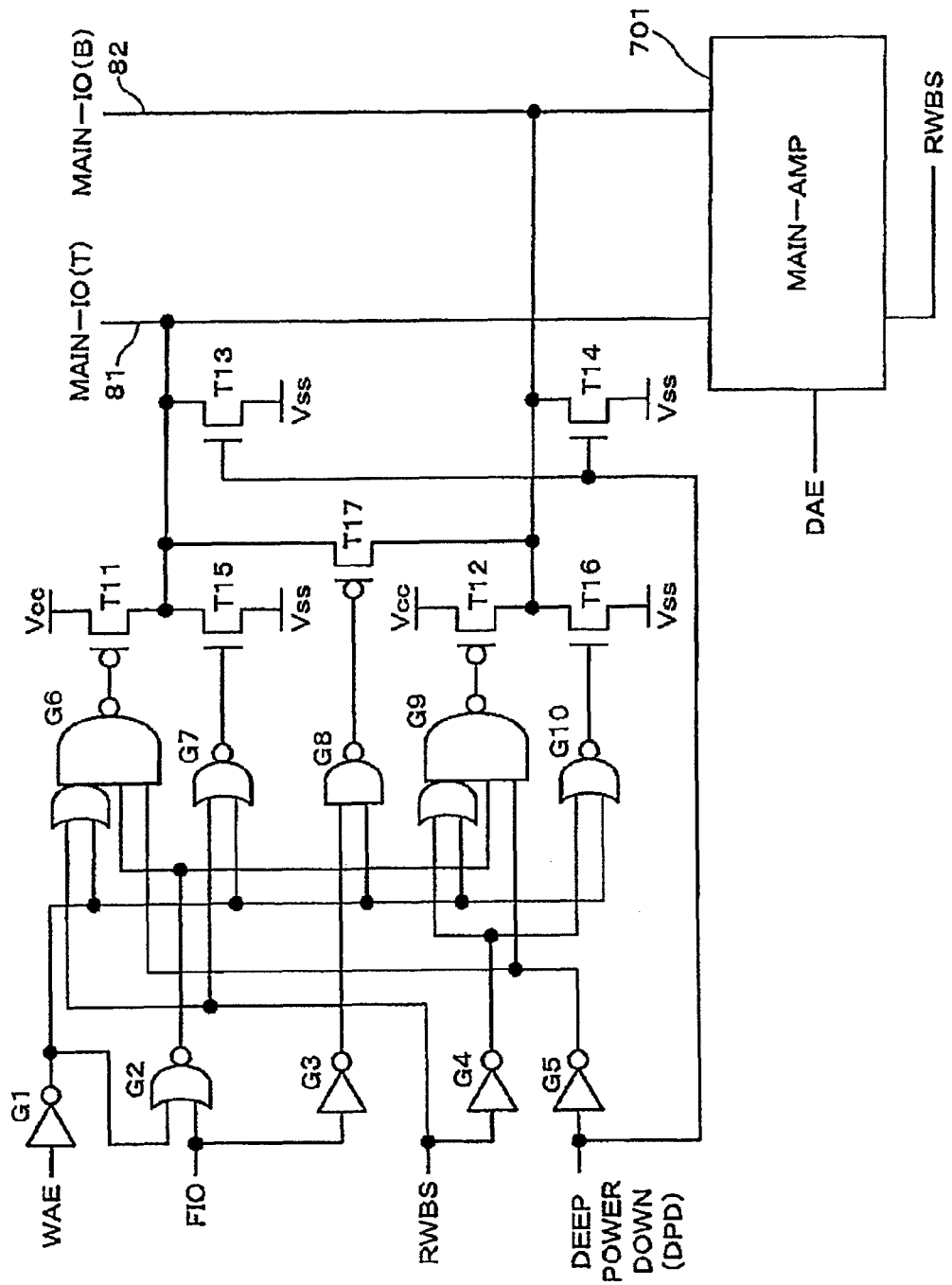
FIG. 4 is a block diagram showing a configuration example of a circuit for precharging the MIO line pair to "H" level in the semiconductor memory device 100 according to the embodiment.

Next, referring to FIG. 4, a configuration example of a circuit for precharging the MAIN-IO (T) 81 and MAIN-IO (B) 82 will be described. The example shown in FIG. 4 is a configuration corresponding to the one described with reference to FIG. 1 from which the local amplifiers 2 and the CIO line pair 10 are omitted. The circuit shown in FIG. 4 is different from the circuit described with reference to FIG. 7 in the features as described below. In this circuit, composite gates G6 and G9 are provided in place of the composite gates G6a and G9a of FIG. 7, and the transistors T13 and T14 as described with reference to FIG. 3C are connected to the MAIN-IO (T) 81 and MAIN-IO (B) 82. The circuit shown in FIG. 4 includes the MAIN-IO (T) 81 and MAIN-IO (B) 82, gates G1 to G10, a main amplifier circuit 701, and transistors T11 to T17. In the configuration example shown in FIG. 4, the transistors T11, T12 and T17 correspond to the transistors T18 and T19 shown in FIG. 3C. Signals output from the gates G6, G8 and G9 in FIG. 4 are control signals corresponding to the MAIN-IO precharge signal shown in FIG. 3C.

Specifically, in the example shown in FIG. 3, the MAIN-IO (T) 81 and MAIN-IO (B) 82 are connected to the main amplifier circuit 701 and to the transistors T11 to T17. In this case, the MAIN-IO (T) 81 is connected to the drains of the p-channel MOS transistor T11 and the n-channel MOS transistor T15. The MAIN-IO (T) 81 is further connected to the drain of the n-channel MOS transistor T13. The MAIN-IO (B) 82 is connected to the drains of the p-channel MOS transistor T12 and the n-channel MOS transistor T16. The MAIN-IO (B) 82 is further connected to the drain of the n-channel MOS transistor T14. The sources of the p-channel MOS transistors T11 and T12 are connected to the power supply Vcc, and the sources of the n-channel MOS transistors T15 and T16 are connected to the ground Vss. The sources of the n-channel MOS transistors T13 and T14 are connected to the ground Vss. The drain and source of the p-channel MOS transistor T17 are connected to the MAIN-IO (T) 81 or the MAIN-IO (B) 82.

The gate of the transistor T11 is connected to a negative logic output of the OR-NAND composite gate G6. The gate of the transistor T15 is connected to a negative logic output of the NOR gate G7. The gate of the transistor T17 is connected to a negative logic output of the NAND gate G8. The gate of the transistor T12 is connected to a negative logic output of the OR-NAND composite gate G9. The gate of the transistor T16 is connected to a negative logic output of the NOR gate G10. A deep power down signal is input to the gates of the transistors T13 and T14.

A control signal WAE which becomes "H" level during WRITE mode is input to the inverter G1. An output of the inverter G1 is connected to one of the inputs of the NOR gate G2, one of the OR inputs of the composite gate G6, one of the inputs of the NOR gate G7, one of the inputs of the NAND gate G8, one of the OR inputs of the composite gate G9, and one of the inputs of the NOR gate G10.

A control signal FIO which becomes "H" level during precharge of the LOCAL-IO (T) 91 and LOCAL-IO (B) 92 is input to the other input of the NOR gate G2 and to the inverter G3. An output of the inverter G3 is connected to the other input of the NAND gate G8. An output of the NOR gate G2 is connected to one of the AND inputs of the composite gate G6 and one of the AND inputs of the composite gate G9.

Data on the read/write bus RWBS is input to the other OR input of the composite gate G6, the other input of the NOR gate G7, and an input of the inverter G4. An output of the inverter G4 is connected to the other OR input of the composite gate G9 and the other input of the NOR gate G10. When data is written, complementary write data is generated based on the data on the read/write bus RWBS and is output to the MAIN-IO (T/B), whereby the data is written in the memory via the LOCAL-IO, although not described in detail.

A control signal DPD which becomes "H" level during deep power down mode is input to the inverter G5. An output of the inverter G5 is connected to the other AND input of the composite gate G6 and the other AND input of the composite gate G9.

A control signal DAE for activating the main amplifier is input to the main amplifier circuit 701, and the main amplifier circuit 701 amplifies, based on the control signal DAE, the data which has been retrieved from the memory cell to the MAIN-IO (T/B) via the data LOCAL-IO (T/B) during data read mode, and outputs the amplified data to the read/write bus RWBS. The MIO lines 81 and 82 are precharged to "H" level (power supply voltage Vcc) by the circuit shown in FIG. 4 when the control signal FIO is "L" level. During deep power down mode, the MIO lines 81 and 82 are controlled to "L" level (Vss level) by the transistors T13 and T14 being turned on.

Figure 5:
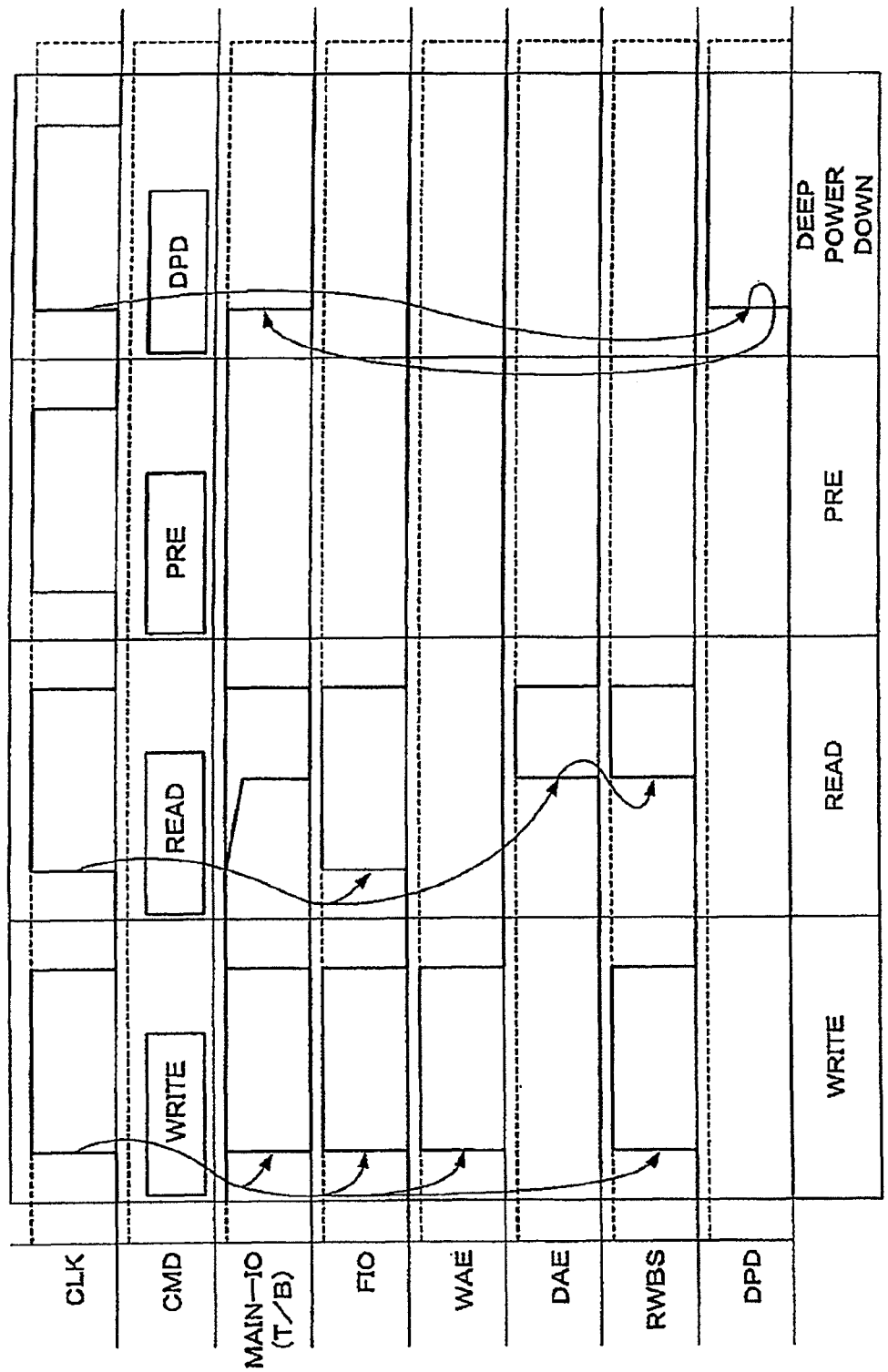
FIG. 5 is a timing diagram showing various operations and changes of control signals in the semiconductor memory device 100 according to the embodiment.

Referring to FIG. 5, operation of the semiconductor memory device 100 according to this embodiment described above with reference to FIGS. 1 to 4 will be described. FIG. 5 is a timing chart with time plotted along the horizontal axis and schematically representing changes in the internal clock signal CLK, externally input command CMD, MIO line pair 8, and control signals FIO, WAE, DAE, RWBS and DPD when four types of commands consisting of WRITE, READ, precharge (PRE) and deep power down (DPD) are input. It is assumed here that, before the commands are input, the MIO line pair 8 is at "H" level (hereafter, denoted as "H") while the other control signals are at "L" level (hereafter, denoted as "L").

When a WRITE command is input, during WRITE mode, the MIO line pair 8 changes to "L", the control signal FIO changes to "H", the control signal WAE changes to "H", and the control signal RWBS changes to "H" at rising of the next clock CLK. On the other hand, the control signal DAE and the control signal DPD do not change and remain at "L". At falling of the next clock CLK, the MIO line pair 8 changes to "H", the control signal FIO changes to "L", the control signal WAE changes to "L", and the control signal RWBS changes to "L".

When a READ command is input, the control signal FIO changes to "H" at rising of the next clock CLK. On the MIO line pair 8, a signal is gradually generated according to a memory value stored in a memory cell selected based on an address signal or the like (not shown) input from the outside. In response to this, the control signal DAE changes to "H" and the control signal RWBS changes to "H" at a timing delayed by a predetermined time from rising of this clock CLK. On the other hand, the control signal WAE and the control signal DPD do not change and remain at "L". At falling of the next clock CLK, the MIO line pair 8 changes to "H", the control signal FIO changes to "L", the control signal DAE changes to "L", and the control signal RWBS changes to "L".

When a precharge (PRE) command is input to precharge the LOCAL-IO, the MIO line pair 8 does not change and remains at "H", and the other control signals do not change and remain at "L".

When a deep power down (DPD) command is input, the control signal DPD changes to "H" at rising of the next clock CLK, while the other control signals do not change and remain at "L". This deep power down (DPD) command is input, for example, by setting the clock enable signal to "L" and setting another predetermined control signal to a predetermined level. When the control signal DPD changes to "H", the transistors T13 and T14 shown in FIG. 3C and FIG. 4 are turned on, and hence the MIO line pair 8 changes to "L". At this time, the voltage hVcc and the voltage VARY output from the internal power supply circuit 601 are at the level of the ground voltage Vss. From then until the deep power down (DPD) command is ended (for example, until the clock enable signal is changed to "H"), the levels of the signals are kept unchanged.

In the semiconductor memory device 100 according to this embodiment, as described above, the circuit for precharging the MIO line pair 8 sets the MIO line pair 8 to the ground Vss upon receiving the deep power down signal during deep power down mode. Accordingly, the difference in potential between the MIO line pair 8 and the LIO line pair 9 can be substantially nullified, and hence generation of consumption current due to leak current can be reduced. Further, it is made possible to omit a switching element that is otherwise used for supplying and stopping supplying the peripheral circuit voltage VPERI to the peripheral circuit 401, and therefore the chip area also can be reduced.

Figure 8:
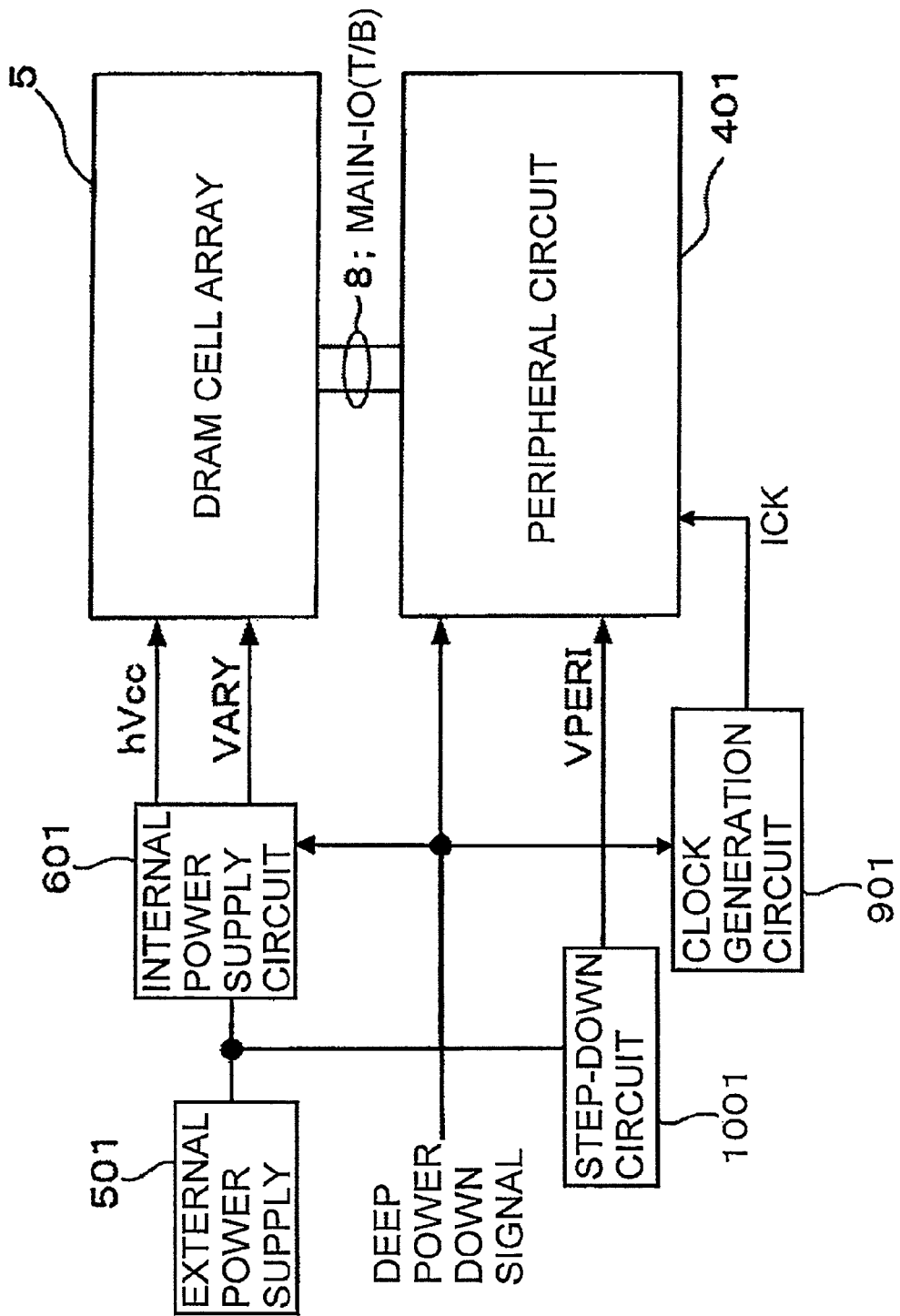
FIG. 8 is a modification example of the embodiment of the invention.

In the semiconductor memory device 100 according to this embodiment, although the MIO line pair 8 is set to the ground Vss by turning the transistor T13 and T14 on during deep power down modes, this control is not performed during other power down modes, which include, for example, active power down mode in which the operation mode transitions from idle state to power down mode, and idle power down mode in which the operation mode transitions from active state to power down mode. In these power down modes, the memory cells are supplied with clocks as well as power, whereby data retention in the memory cells can be ensured. Further, although the description in FIG. 3B of the embodiments above has been made on the assumption that the supply voltage VPERI supplied to the peripheral circuit is the power supply voltage Vcc, the circuit shown in FIG. 3B may include, as shown in FIG. 8, a circuit for stepping down the power supply voltage Vcc to supply a voltage lower than Vcc. It should be noted that the components of FIG. 8 are the same as those of the foregoing embodiments except a step-down circuit 1001. Therefore, the same components and parts are denoted by the same reference numerals, and description thereof will be omitted.

It is apparent that the present invention is not limited to the above embodiments, but may be modified and changed without departing the scope and spirit of the invention.

What is claimed is:

1. A method comprising:
   supplying an clock signal to a peripheral circuit, the peripheral circuit being connected to a memory cell array;
   supplying an operation voltage to the memory cell array and the peripheral circuit during normal operation mode;
   stopping the supply of the operation voltage to the memory cell array without stopping the supply of the operation voltage to the peripheral circuit during deep power down mode in which the generation of the clock signal is stopped.

2. The method according to claim 1, wherein the stopping includes stopping the supply of the operation voltage to the memory cell array in response to deep power down command from external to a device which comprises the peripheral circuit and the memory cell array.

3. The method according to claim 1, wherein the peripheral circuit comprises a control circuit that sets a plurality of input/output lines, by way of which the peripheral circuit is connected to the memory cell array, to a first level during the deep power down mode.

4. The method according to claim 1, further comprising:
   controlling a plurality of input/output lines, by way of which the peripheral circuit is connected to the memory cell array, to a first level during the deep power down mode,
   wherein the memory cell array includes a plurality of local input/output lines and a plurality of memory cells,
   wherein the plurality of local input/output lines are connected to the plurality of memory cells via a predetermined bit line, the local input/output lines being connected to the input/output lines.

5. The method according to claim 1, further comprising:
   supplying a potential to precharge a plurality of local input/output lines to an intermediate potential during the normal operation mode; and
   supplying a second potential that is different from the intermediate potential during the deep power down mode,
   wherein the memory cell array includes the plurality of local input/output lines and a plurality of memory cells,
   wherein the plurality of local input/output lines are connected to the plurality of memory cells via a predetermined bit line, the local input/output lines being connected to a plurality of input/output lines by way of which the peripheral circuit is connected to the memory cell array.

6. The method according to claim 5, further comprising:
   setting the input/output lines to a potential that is the same potential as the second potential during the deep power down mode.

7. The method according to claim 3, wherein the control circuit is a pair of switching elements configured to establish a connection or disconnection state between the ground and a plurality of input/output lines by way of which the peripheral circuit is connected to the memory cell array, and to be controlled in the connection state during the deep power down mode.

8. The method according to claim 5, further comprising:
   stopping the supply of precharge voltage to the local input/output lines during the deep power down mode.

9. The method according to claim 1, wherein:
   the peripheral circuit further comprises a precharge circuit to stop precharge of a plurality of input/output lines by way of which the peripheral circuit is connected to the memory cell array when a control signal generated in response to an input of a READ or WRITE command is in an active state, and to precharge the input/output lines at least when the READ and WRITE commands are not input; and
   the precharge circuit stops the precharge operation upon receiving a deep power down command designating the deep power down mode.

10. A semiconductor memory device comprising:
    a peripheral circuit connected to a memory cell array;
    a first terminal for receiving a clock signal to be supplied to the peripheral circuit;
    a second terminal for receiving a voltage to be supplied to the memory cell array, the voltage varying with whether the clock signal is supplied to the first terminal.

11. The semiconductor memory device according to claim 10, further comprising:
    a third terminal for receiving another voltage to be supplied to the peripheral circuit,
    wherein the another voltage is independent of whether the clock signal is supplied to the first terminal.

12. The semiconductor memory device according to claim 10, wherein the voltage when the clock signal is supplied to the first terminal is closer to a predetermined power supply voltage of the memory cell array than the voltage when the clock signal is not supplied to the first terminal.

13. A semiconductor memory device comprising:
    a peripheral circuit connected to a memory cell array by way of a plurality of input/output lines; and
    a clock generation circuit that supplies an clock signal to the peripheral circuit,
    wherein the peripheral circuit comprises a precharge circuit to stop precharge of the input/output lines when a control signal generated in response to an input of a READ or WRITE command is in an active state, and to precharge the input/output lines at least when the READ and WRITE commands are not input, and
    wherein the precharge circuit stops the precharge operation upon receiving a deep power down command designating the deep power down mode in which the clock generation by the clock generation circuit is stopped.

14. The semiconductor memory device according to claim 13, wherein the peripheral circuit comprises a control circuit that sets the input/output lines to a first level during the deep power down mode.

15. The semiconductor memory device according to claim 13, comprising:
    a plurality of local input/output lines provided in the memory cell array and connected to a plurality of memory cells of the memory cell array via a predetermined bit line, the local input/output lines being connected to the input/output lines; and a control circuit that controls the input/output lines to a first level during the deep power down mode.

16. The semiconductor memory device according to claim 14, wherein the control circuit is a pair of switching elements configured to establish a connection or disconnection state between the ground and main input/output lines constituting the input/output lines, and to be controlled in the connection state during the deep power down mode.

* * * * *